United States Patent
Wang et al.

[19]

[11] Patent Number: 5,831,472
[45] Date of Patent: Nov. 3, 1998

[54] INTEGRATED CIRCUIT DESIGN FOR SINGLE ENDED RECEIVER MARGIN TRACKING

[75] Inventors: Paul P. S. Wang, Dana Point; Alan M. Yoshida, Irvine; David A. Peeters, Cerritos, all of Calif.

[73] Assignee: Adaptec, Inc., Milpitas, Calif.

[21] Appl. No.: 829,051

[22] Filed: Mar. 31, 1997

[51] Int. Cl.[6] .................................................. G05F 1/10
[52] U.S. Cl. ......................... 327/543; 327/539; 327/541
[58] Field of Search ................................. 327/538, 540, 327/541, 543, 513, 333, 539; 323/313, 316; 326/87

[56] References Cited

U.S. PATENT DOCUMENTS

| | | | |
|---|---|---|---|
| 4,410,813 | 10/1983 | Barker et al. | 327/535 |
| 4,430,582 | 2/1984 | Bose et al. | 327/541 |
| 5,194,765 | 3/1993 | Dunlop et al. | 327/112 |

*Primary Examiner*—Kenneth B. Wells
*Attorney, Agent, or Firm*—Christie, Parker & Hale, LLP

[57] ABSTRACT

An integrated circuit is provided which allows tracking and compensation for shifts in a line receiver's input threshold caused by manufacturing process parameter and temperature variations. The circuit includes an input threshold reference circuit which develops a steady-state input threshold, the same as the input threshold of a line receiver circuit. The steady-state input threshold value is compared to a design reference value, implemented as a resistive voltage divider, which is insensitive to manufacturing process parameter and temperature variations. Input threshold references and reference voltages are compared and, depending on the magnitude and polarity of the difference between the steady-state input threshold and its design value, additional pull-up or pull-down transistors are switched into the conduction leg of the line receiver, in order to adjust the line receiver's input threshold to a value within the design input threshold margin budget.

20 Claims, 5 Drawing Sheets

INTEGRATED CIRCUIT DESIGN FOR SINGLE ENDED RECEIVER MARGIN TRACKING

FIELD OF THE INVENTION

In general, the invention relates to the field of integrated circuit single ended receivers; more particularly, it relates to an input receiver that provides for better control of input receiver threshold by self correcting the input threshold for process and temperature variations.

BACKGROUND OF THE INVENTION

Extensive research efforts in the field of integrated circuits for many years have been directed to developing practical techniques for increasing their speed and their operational reliability. Improved techniques for increasing operational reliability have been an important enabling factor in the trend toward faster and more capable electronic circuits such as computers.

The switching performance of digital integrated circuits is commonly expressed in terms of noise margin; analytically it is expressed as the stability of a circuit switching threshold, particularly in the modern low power, low current environment. Although the trend in recent years has been to continually reduce the size of individual transistors comprising integrated circuits, thus increasing their switching speed, the size reduction is only possible by a corresponding reduction in power supply voltage and a consequent reduction in switching current. Given such a reduction in power supply voltage and switching current, modern integrated circuit transistors, and the integrated circuits constructed therefrom, find themselves substantially more susceptible to unavoidable variations in manufacturing process parameter tolerances, operating temperature, power supply voltage variations, and the like.

In particular, integrated circuits adapted to function as line transceivers interfacing with a high speed data bus such as for example, the SCSI bus of a modern computer system, are most commonly implemented as an input inverter or inverters, configured to have a switching threshold of from between 1.60 to 1.90 volts (V) for positive going signals and, in the case of hysteresis, a switching threshold of from between 1.00 to about 1.30 V for negative going signal. Input receivers on prior art line transceivers commonly exhibit a 450 mV variation in input receiver thresholds, due to the above-mentioned variations in process tolerance, temperature and power supply voltage. Given such a substantial variation in input receiver thresholds, it can be seen that there is a substantial danger of being unable to differentiate between a positive going and a negative going signal, resulting in corrupted data transmission and even circuit oscillation.

Some attempts have been made in the prior art to minimize the total budget for input threshold shift by providing a band gap reference voltage with which to account for variations in the power supply voltage ($V_{DD}$). Although helpful to some extent in controlling power supply variations, band gap reference circuits consume power as well as valuable chip floor plan real estate.

Even with such a band gap reference, prior art input receivers are not able to account for variations in process tolerance parameter shifts or the effects of localized thermal abnormalities. When it is considered that the variation in $V_{DD}$ is commonly in the range of about 180 mV, it will be seen that these other sources of variability can affect input threshold by as much as 270 mV. Accordingly, there is a demonstrated need for an input receiver which is able to account for process parameter and temperature related sources of variability in order to realize an input receiver threshold shift budget on the order of less than 300 mV. Such a circuit should be able to be self-correcting with respect to changes in the sources of variability over time. And in addition, operate to be more resistant to process and temperature variations while requiring a minimal amount of power and chip floor plan overhead.

SUMMARY OF THE INVENTION

In accordance with practice of principles of the invention a CMOS integrated circuit line receiver is configured as an inverter and connected between $V_{DD}$ and ground. The line receiver further includes a plurality of individually, selectively enablable pull-up and pull-down transistors connected in parallel fashion into the pull-up and pull-down conduction legs of the line receiver circuit. As the input threshold of the line receiver circuit varies in response to manufacturing process parameter shifts, particular ones of the individually enablable pull-up or pull-down transistors are added to the conduction path by applying an appropriate turn-on voltage to their gate terminals. By parallel connecting additional pull-up or pull-down transistors into the line receiver's conduction path, the β of the pull-up or pull-down leg is increased a pre-determined amount in accordance with the added transistor's W/L ratio. The input threshold value is accordingly adjusted to more closely approximate the design value and to fall within a pre-determined input threshold margin window.

The on-chip input threshold value is characterized by an input threshold reference circuit, configured as a CMOS integrated circuit inverter and constructed from n-channel and p-channel transistors having the same design size as, and located in proximity to, the n-channel and p-channel transistors of the line receiver circuit. The output and input of the input threshold reference circuit are coupled together in common, so as to define a steady-state on-chip input threshold value.

In accordance with the invention, a voltage divider network, constructed of ratioed resistors, establishes a plurality of reference voltages and defines a set of nested input threshold margin windows. Comparison means are provided to compare the input threshold value of the input threshold reference circuit to the reference voltages established by the resistors and determine the magnitude and polarity of the input threshold shift caused by manufacturing process parameter variations.

The outputs of the comparison means are connected through a logic circuit to the individually enablable pull-up and pull-down transistors of the line receiver circuit so as to provide an appropriate turn-on voltage to particular ones of the gates of the selectively addable transistors.

In one aspect of the invention, the comparison means determines whether the input threshold value of the input threshold reference circuit falls above or below a pre-determined reference value. If the input threshold value is determined to be above the reference value, the comparison means provides a selection signal to selectively enable an additional pull-down transistor connected in parallel fashion to the line receiver, so as to increase the pull-down β of the line receiver and thereby reduce the input threshold. In contrast, if the input threshold value of the input threshold reference circuit is below a pre-determined reference value, the comparison means provides a selection signal to a selectively addable pull-up transistor, connected in parallel fashion to the pull-up conduction path of the line receiver, so as to increase the pull-up β. The input threshold value of the line receiver is consequently increased thereby.

In another aspect of the invention, additional reference voltages are provided to more completely characterize the magnitude and polarity of an input threshold shift. A logic circuit evaluates the results of a comparison between the input threshold value of the input threshold reference circuit and the reference voltages defined by the resistors. In response to the comparison, the logic circuit provides a multiplicity of selection signals to a multiplicity of individually, selectively enablable pull-up or pull-down transistors connected in parallel fashion to the line receiver, to more precisely adjust the input threshold of the line receiver circuit to its design value.

In a yet further aspect of the present invention, once selection signals have been determined for particular ones of the individually enablable pull-up or pull-down transistors of the line receiver, the selection signals are maintained in a latch. Power down circuit means are connected to the resistors, the input threshold reference circuit and the comparison means in order to conserve power, but maintain the input threshold of the line receiver within its design margin window.

BRIEF DESCRIPTION OF THE DRAWINGS

These and other features, aspects, and advantages of the present invention will be more fully understood when considered with respect to the following detailed description, appended claims, and accompanying drawings, wherein:

DETAILED DESCRIPTION OF THE PREFERRED EMBODIMENT(S)

Before entering into any great detail about the embodiments of the present invention, it will be necessary to provide a certain amount of background information about the construction and operation of the components of the circuit of the present invention. In addition, this background information will be particularly suitable for defining signal conventions and terms which will be used in the explanation of the illustrated embodiments below.

Figure 1:
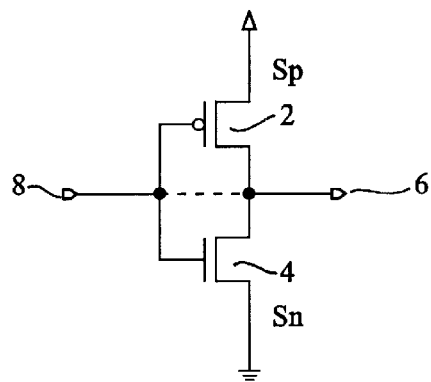
FIG. 1 is a schematic diagram of a simple, exemplary single ended input receiver configured as an inverter, according to the prior art.

Although a wide range of electronic component technologies are suitable for implementation according to practice of principles of the present invention, the circuitry of the invention is preferably implemented in CMOS technology which comprises complementary n-channel and p-channel field effect transistors, as is well understood in the art. In FIG. 1, a complementary CMOS FET pair comprising a p-channel transistor 2 and an n-channel transistor 4 are connected to operate as a simple CMOS inverter. Each of the FET's are connected together at their drain node (denoted D in FIG. 1) which in turn defines an output 6, conventionally termed $V_{out}$. Each of the FET's have their gate terminals (denoted G in FIG. 1) connected together to define an input node 8, conventionally termed $V_{in}$.

A power supply voltage, conventionally termed $V_{DD}$ is connected to the source terminal (denoted $S_p$ in FIG. 1) of the p-channel transistor 2, while the source terminal of the n-channel transistor $S_n$ is connected to more commonly ground, but may be connected to a second power supply voltage $V_{SS}$, lower than $V_{DD}$.

Conventionally, when a voltage ($V_{in}$) is applied to the input 8, the input voltage further defines a potential difference between the input 8 and the source terminal of the n-channel transistor, termed $V_{GSn}$ or the n-channel gate-source voltage. Further, the input voltage defines a potential difference between the gate terminal and the source terminal of the P-channel transistor, termed $V_{SGP}$.

As $V_{in}$ is increased from for example, 0 V to $V_{DD}$, the inverter output, $V_{out}$ is initially at a high value ($V_{OH}$), approximating $V_{DD}$ until such time as $V_{in}$ increases to a particular characteristic value, between $V_{IL}$ and $V_{IH}$, at which both transistors are operating in the triode region, ie, the p-channel transistor 2 begins to turn off and the n-channel transistor 4 begins to conduct.

Figure 2:
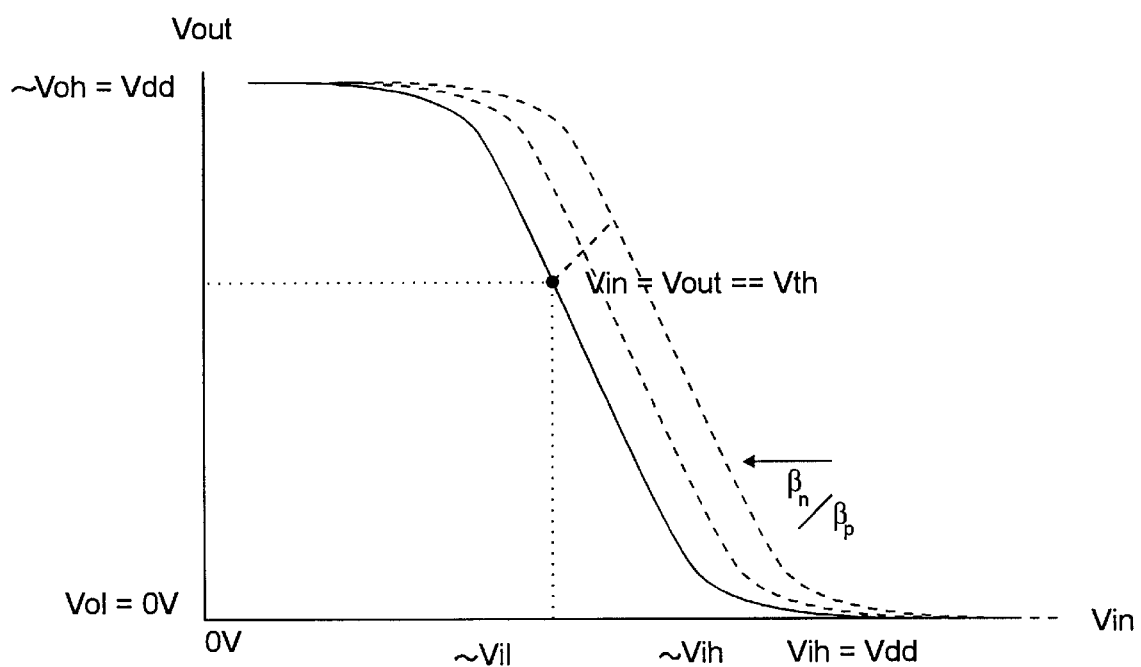
FIG. 2 is a graph of the $V_{in}/V_{out}$ transfer characteristic of the inverter implemented single ended input receiver of FIG. 1.

Turning now to FIG. 2, there is depicted a voltage transfer curve of the exemplary CMOS inverter circuit of FIG. 1, where the vertex is defined as 0 V, increasing $V_{in}$ is plotted on the horizontal axis and increasing $V_{out}$ is plotted on the vertical axis. As can be seen from FIG. 2, when $V_{in}$ is at 0 V, $V_{out}$ is defined as $V_{OH}$, approximately equal to $V_{DD}$. Slight increases of $V_{in}$ have little effect on the value of $V_{out}$ which remains at substantially $V_{OH}=V_{DD}$ until $V_{in}$ reaches a first characteristic value exceeding $V_{IL}$. At $V_{in}>V_{IL}$, the n-channel transistor begins to turn on, causing the transfer characteristic to roll-over and decrease, in a very steep manner with increasing n-channel conduction, until $V_{out}$ reaches a value, $V_{out}=V_{OL}$, approximately equal to 0 V.

In the opposite case, where $V_{in}$ initially is equal to $V_{DD}$ and decreases to 0 V, $V_{out}$ is substantially equal to $V_{OL}=0$ V until $V_{in}$ drops to a value, $V_{in}<V_{IH}$, at which voltage value the p-channel transistor turns on and $V_{out}$ sharply increases to $V_{OH}$ approximately equal to $V_{DD}$. It should be noted that in the examples of FIG. 1 and FIG. 2, no provision has been made for the effects of hysteresis. Accordingly, the transfer characteristic of FIG. 2 will be understood to be a simplified one.

As depicted in FIG. 2, an input threshold, defined herein as $V_{TH}$, is defined as that point on the transfer characteristic curve where $V_{out}=V_{in}$. An alternative method of developing the input threshold, as opposed to graphically defining the point on a transfer characteristic, would be simply to connect the output node to the input node of the CMOS inverter and measuring the potential developed at the commonly connected node with respect to ground on the lowest power supply potential. Various other alternative methods for obtaining the input threshold are well understood by those having skill in the art of integrated circuit design, and are equally suitable for defining the input threshold, but however obtained it is an important feature of the input threshold that its value is defined as that point at which $V_{in} = V_{out}$.

The importance of a clear definition of the input threshold will be understood when it is realized that its value is defined in terms of the inverter's operational potentials which are in turn, a function of the "strength" of the p-channel 2 and n-channel 4 transistors. It is well understood in the art of CMOS integrated circuit design that the transfer characteristic curve will shift (either left or right along the horizontal axis of FIG. 2) as the ratio of the n and p channel transistor betas (β) increase or decrease. Necessarily, this transfer characteristic shift with the ratios of β will cause a consequent shift in the value of the input threshold. In turn, the β of an n-channel and p-channel transistor is defined, respectively, by equations 1 and 2 as follows:

$$\beta_n = k_n' \left( \frac{W}{L} \right)_n .$$  Equation 1

$$\beta_p = k_p' \left( \frac{W}{L} \right)_p .$$  Equation 2

Where k' is the device transconductance, W is the width of the respective transistor's conductive channel and L is the length of each respective transistor's conductive channel. Accordingly, it will be understood that the expression W/L is a channel aspect ratio parameter and is inversely proportional to the device's resistance characteristic. In addition, the device transconductance parameter, k', is a function of carrier surface mobility and the capacitance of each of the respective transistor's gates. In general, $k'_n$ is greater than $k'_p$. In any case, it will be thus seen that both the absolute value as well as the variability of k' depends on the precision of the semiconductor manufacturing process, as well as the skill of the circuit designer in choosing geometric quantities that will minimize the unavoidable effects of semiconductor process variations.

In summary, those having skill in the art of CMOS integrated circuit design will understand that the "strength" of an n-channel and p-channel transistor ultimately depends on the semiconductor manufacturing process parameters, particularly resistivities (a function of dopant concentrations and gradients), capacitances (a function of oxide growth regimes) and geometries (a function of the photolithographic process).

In accordance with practice of principles of the invention, in order to minimize the inherent variability of the above-mentioned process parameters, it is first necessary to characterize their effects on input threshold on an actual circuit as implemented in silicon. In order to characterize input threshold variability, an integrated circuit designer must first define a desired input threshold value, second implement the circuit in the desired semiconductor technology, third compare the actual input threshold of the implemented circuit to a reference, and fourth, depending on the direction and magnitude of any detected input threshold shift, adjust the "strength" of either the n-channel transistor, the p-channel transistor, or both.

Figure 3:
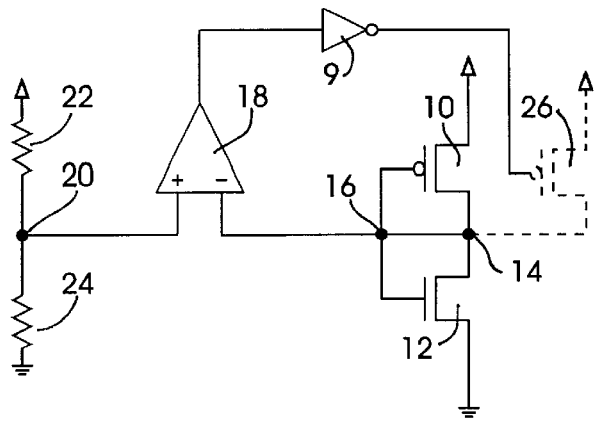
FIG. 3 is an integrated circuit schematic diagram of an input threshold characterization circuit in accordance with practice of principles of the invention.

Turning now to FIG. 3, there is depicted an exemplary integrated circuit suitable for characterizing an input threshold and determining whether an input threshold has increased or decreased with regard to its design value.

In FIG. 3, a CMOS inverter comprising a p-channel transistor 10 and an n-channel transistor 12 has its output node 14 coupled to its input node 16 which is in turn, connected to the negative-input side of a comparator 18. As was the case with the exemplary inverter of FIG. 1, the p-channel transistor 10 of the inverter FIG. 3, is source-connected to a power supply voltage $V_{DD}$, while the n-channel transistor 12 is source-connected to ground. Configured in this manner, it should be understood that the voltage appearing on the input node 16 will be equal to the voltage appearing on the output node 14 and will thus define the input threshold of the inverter circuit.

The second, or positive, input of the comparator 18 is coupled to a reference voltage node 20 which is in turn, connected to the power supply voltage $V_{DD}$ through a resistor 22 and to ground through a second separate resistor 24. The resistors 22 and 24 function as voltage dividers and are designed with characteristic impedances to provide a reference voltage $V_R$ at node 20 which is intended to be identical with the designed input threshold $V_{TH}$ of the inverter. Since resistors 22 and 24 are manufactured from the same material using the identical semiconductor process technologies as are the transistors of the inverter, it will be well understood by those having skill in the art of integrated circuit design that variations in resistivity, temperature, photolithographically defined geometries, and the like will affect the resistors in the same manner as they affect the transistors. However, the resistive divider circuit (resistor 22 and 24) is implemented in silicon merely as a ratio. Resistivity variations, for example, will effect both resistors in an identical fashion, and it is well understood that "ratioing" resistors in semiconductor technology obviates photolithographic process variations. Accordingly, regardless of variation in the intrinsic resistivity of an individual resistor, the ratio of their values will not change, such that the reference voltage value at reference node 20 ($V_R$) remains stable and constant with respect to manufacturing process and temperature variations.

In accordance with the practice of the present invention, the comparator 18 compares the value of reference voltage $V_R$ with the input threshold of the inverter ($V_{TH}$) and is configured to provide an output signal depending on the relative magnitudes of $V_R$ and $V_{TH}$. Specifically, if it is determined that $V_{TH}$ is less than $V_R$, the input threshold has decreased from its nominal design value (represented by $V_R$). The input threshold may be subsequently raised by, for example, adding an additional p-channel resistor to the circuit, such as p-channel transistor 26 indicated in FIG. 3 in phantom. The gate of this additional p-channel transistor 26 is controlled by the output of the comparator 18, with the comparator providing a gate control signal of appropriate polarity, through inverting element 9, if it is determined that $V_{TH}$ is less than $V_R$.

Figure 4:
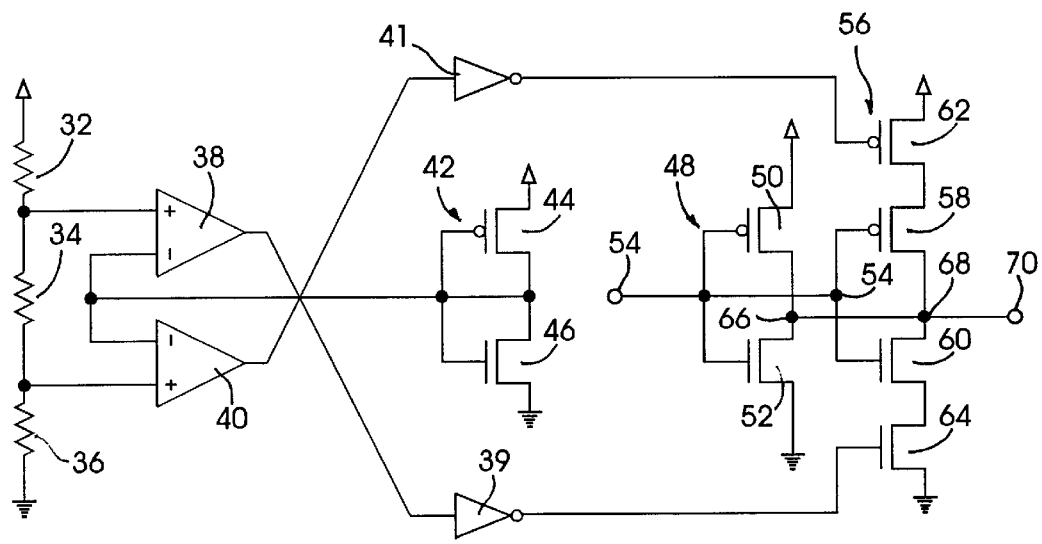
FIG. 4 is an integrated circuit schematic diagram of a three-resistor case input threshold characterization circuit including a single ended line receiver with selectively addable pull-up and pull-down active components.

While the exemplary input threshold characterization circuit of FIG. 3 is helpful in fostering an understanding of the present invention, FIG. 4 depicts an embodiment of an integrated circuit in which the present invention is functionally embodied in combination with a line receiver. In contrast with the two resistor case illustrated in FIG. 3, the embodiment of FIG. 4 is configured with a voltage divider comprising three resistors 32, 34 and 36 connected in series fashion between $V_{DD}$ and ground. The three resistor case is devised such that two comparators 38 and 40 are provided, each with its respective positive input coupled to resistive divider nodes disposed between the three resistors. A first comparator 38 has its positive input connected to a node in the path between $V_{DD}$ and ground at a point between the first and second resistors 32 and 34 respectively. Thus, the positive input of the first comparator 38 will experience an input voltage equal to $V_{DD}$ minus the IR drop across resistors The positive input of the second comparator 40 is likewise connected to the path between $V_{DD}$ and ground at a point between the second and third resistors 34 and 36 respectively. Thus, the positive input of the second comparator 40 will experience an input voltage equal to $V_{DD}$ minus the IR drops across the first and second resistors 32 and 34. In addition, it will be understood that the differential between the voltages appearing on the positive inputs of the comparators 38 and 40 will be equal to the equivalent IR drop across the central resistor 34.

An input threshold reference circuit 42 suitably comprises a p-channel transistor 44 and an n-channel transistor 46, connected together at their gate electrodes, to function as an inverter. In addition, the inverter output is connected to the gate electrode signal line such that the input threshold reference circuit 42 is configured to develop a steady state voltage, equal to the threshold voltage ($V_{TH}$) at both the input and output, i.e., $V_{in}=V_{out}$ thus defining $V_{TH}$. The input signal line to the reference circuit 42 is connected to the negative input of both the first and second comparators 38 and 40, thus applying the steady state threshold voltage ($V_{TH}$) to the negative inputs of the comparators.

An exemplary line receiver circuit is provided in accordance with practice of the invention and suitably comprises a conventional receiver section 48 configured, classically, as a two element inverter with a p-channel transistor 50 configured as a pull-up device to $V_{DD}$ and an n-channel transistor 52 configured as a pull-down device to ground. A signal input 54 is provided which is in turn connected to the gate electrodes of the p and n-channel transistors 50 and 52 respectively. The receiver circuit further comprises a quasi-inverter circuit 56, coupled in parallel fashion to the inverter 48. The line receiver input 54 is connected to the gate input of the quasi parallel-connected inverter 56 which comprises a first selectively addable p-channel transistor 58 and a first selectively addable n-channel transistor 60 configured, classically as an inverter, and additionally comprises a switchable select p-channel transistor 62 coupled between the selectively addable pull-up transistor 58 and $V_{DD}$ and a switchable select n-channel transistor 64 coupled between the selectively addable pull-down n-channel 60 and ground. The receiver input 54 is likewise coupled to the inverter gate electrodes (transistors 58 and 60) while the output node 66 of the first inverter is coupled to the output node 68 of the second series-connected inverter circuit 56 and further defines the output 70 of the line receiver 48.

In accordance with practice of the invention, the gate electrode of the switchable select p-channel transistor 62 is coupled to the output of the second comparator 40 through an inverting element 41, while the gate electrode of the switchable select n-channel transistor 64 is coupled to the output of the first comparator 38 through an inverting element 39. Inverting elements 39 and 41 are provided in accordance with the invention to apply an appropriate gate voltage to the gates of the switchable select p and n-channel transistors 62 and 64 respectively. As will be understood by one having skill in the art, were the input polarities of the comparators 38 and 40 reversed, there would be no need for the inverting elements.

In operation, it will be understood that in the absence of suitable gate voltages on the switchable select p and n-channel transistors 62 and 64 respectively, the output 70 of the receiver circuit will be defined only by operation of the first inverter 48 comprising the receiver. In accordance with principles of the invention, the transistors 50 and 52 of the first inverter 48 are sized to be identical with the p and n-channel transistors 44 and 46 respectively, of the threshold reference circuit 42. In addition, the threshold reference circuit 42 is preferably constructed in silicon in a region of the integrated circuit chip in close proximity with the p and n-channel transistors 50 and 52 of the first inverter stack of the line receiver circuit. Accordingly, it will be understood that the electronic performance of the transistors comprising the first inverter stack of the line receiver circuit will closely match the electronic performance of the transistors comprising the threshold reference circuit 42. In other words, the first resistor stack coupled to the receiver input 54 will have the same input threshold ($V_{TH}$) as the threshold reference circuit.

This performance matching is particularly important to practice of the invention, when it is realized that the threshold reference circuit 42 provides a basis of comparison to the resistor dividers in order to determine whether the input threshold ($V_{TH}$) of the line receiver circuit is suitably close to the design value, as more accurately reflected by the resistors.

Specifically, if the input threshold of the line receiver is higher than its design value, the input threshold of the threshold reference circuit will likewise be higher to the same degree because of the matching. In the illustrative embodiment of FIG. 4, if the input threshold of the threshold reference circuit 42 has a value which exceeds the IR drop across the first resistor 32, the first comparator 38 turns on and provides a gate voltage $V_G$ to the switchable select n-channel transistor 64 of the second series-connected inverter circuit 56. When transistor 64 is turned on, it has the effect of adding, in parallel fashion, the selectively addable pull-down n-channel transistor 60 to the current conduction path to ground previously defined only by the first inverters n-channel transistor 52. Coupling the additional pull-down n-channel transistor 60 in parallel with the n-channel transistor 52 in the current path, functions to effectively reduce the on resistance of the n-channel leg of the overall inverter circuit, thus reducing the absolute value of the input threshold, in well known fashion. In like manner, if the input threshold of the threshold reference circuit 42 is lower than the design value, the value of $V_{TH}$ of the reference circuit 42 is compared to the IR drop across resistor 36 and, if determined to be lower, the second comparator 40 turns on and provides a suitable gate voltage to the switchable select p-channel transistor 62 of the second parallel-connected quasi-inverter circuit 56. Turning on p-channel transistor 62 consequently adds the selectively addable p-channel transistor 58, of the second stack 56, to the current path between $V_{DD}$ and the output, in parallel with the path through the first inverter's p-channel transistor 50 in the same manner as was described in connection with the n-channel device.

The degree of input threshold adjustment provided by selectively adding additional p-channel or n-channel pull-up or pull-down transistors into the current conduction path, depends in large measure on the design size of the additional transistors being selectively added to the current path. It is well understood by those having skill in the art, for example, that variously sized p-channel and n-channel transistors may be provided in order to adjust the input threshold of an inverter implemented line receiver circuit by 100 mV, 200 mV, or the like. In particular, it can be said that the degree of input threshold adjustment provided by a particular transistor depends on its W/L ratio, all other parameters being held equal. It is customary to refer to n-channel or p-channel transistors as 1×transistors when their W/L ratio (i.e., their length and width dimensions) are in accord with the minimum dimensions provided by the integrated circuit manufacturing design layout rules. In other words, a 1×transistor is the smallest of the transistors allowed by a particular IC technology design rule set. The importance of this particular feature will be recognized when it is realized that as transistor W/L ratios are allowed to increase, a transistor's current capacity ($I_D$) increases in proportion, as may be determined from Equations 1 and 2, above. Since changing a transistor's W/L ratio necessarily changes a transistor's β, and thus adjusts the input threshold of a receiver implemented therefrom, it will be apparent that the additional n-channel and p-channel transistors selectively added to a line receiver's current path are preferably fabricated with varying W/L ratios, each of which is designed to provide an adjustment to the input threshold of a specific amount. Accordingly, the additional n-channel and p-channel transistors selectively added to the conduction path will be fabricated as 1×, 2×, 4×, 8×and the like, transistors, as those terms are understood by one having skill in the art.

It should also be noted, here, that the switchable select transistors are preferably fabricated with large W/Ls in order to minimize their contribution to the input threshold adjustment defined by the selectively addable transistors. In other words, the switchable select transistors function merely as switches. It will be evident, however, that the combination of switchable select and selectively addable transistors can be designed provide the particular degree of input threshold adjustment required, when operating in combination.

The exemplary embodiment of the circuit of FIG. 4 may be further described as including a receiver section having an input and an output, and itself comprising a sequential stack of inverter circuits connected in parallel fashion, and configured with a plurality of signal selectable transistor elements forming the pull-up and the pull-down legs of the inverter stack. The circuit further comprises means for defining a steady-state input threshold value, which value is the same as the input threshold value of the receiver and which is subject to variation due to manufacturing process tolerances, temperature and the like. The circuit further provides means for establishing an additional reference voltage which is only minimally subject to manufacturing process tolerance variations and temperature, and which represents a value related to the design input threshold value. Further, the exemplary circuit of FIG. 4 includes means for comparing the steady-state input threshold of the reference circuit to a second voltage reference and for providing a selection signal in response to the comparison. Selection signals selectively add transistors to the pull-up or pull-down legs of the receiver in response to a comparison determination that the steady-state input threshold is higher or lower than the design value.

Figure 5:
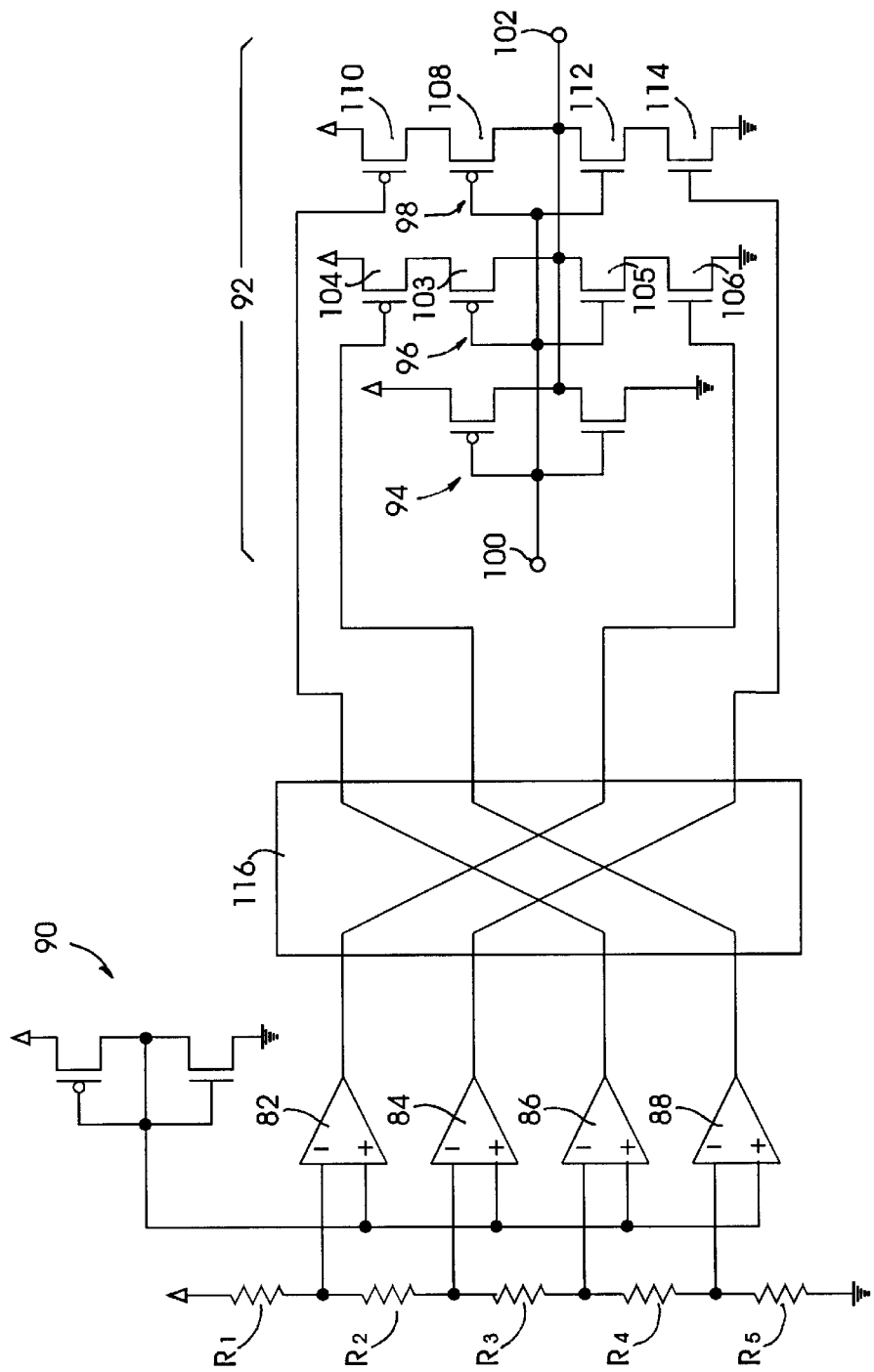
FIG. 5 is an integrated circuit schematic diagram of a five-resistor case input threshold characterization circuit including a single ended line receiver with selectively addable pull-up and pull-down active components.

In accordance with practice of principles in the invention, the concept of comparing an actual input threshold to a reference, or a plurality of references, in order to selectively add additional pull-up or pull-down transistors into a line receiver's current path, can be extended to a multiple reference case, as is illustrated in connection with the five resistor case circuit of FIG. 5. In FIG. 5, design reference voltages are developed across five series-connected resistors, $R_1$, $R_2$, $R_3$, $R_4$ and $R_5$. The series-connected resistors are coupled between a power supply voltage, $V_{DD}$ and ground, although it will be apparent that the ground connection may be equally made to a lower supply voltage such as $V_{SS}$. As was the case in previous embodiments, signal taps are taken from between each of the series-connected resistors, and are provided to the negative input terminal of a respective one of four comparators, 82, 84, 86 and 88.

An input threshold reference circuit 90 is provided and is configured to develop a steady-state input threshold reference voltage which is commonly connected to the positive input terminal of each of the four comparators 82, 84, 86 and 88. Comparator 82 thus compares the input threshold developed by the input threshold reference circuit 90 to the voltage developed by $V_{DD}$ minus the IR drop across resistor $R_1$. Comparator 84 is connected to compare the input threshold to a reference voltage developed by $V_{DD}$ minus the IR drops across resistors $R_1$ and $R_2$. In like manner, comparators 86 and 88 are configured to compare the input threshold developed by the input threshold reference circuit 90 to reference voltages above ground (or $V_{SS}$) developed by the IR drops across resistors $R_4$ and $R_5$ and by the IR drop across resistor $R_5$ respectively.

In accordance with the present invention, the central resistor $R_3$ is given an impedance value such that the IR drop across resistor $R_3$ defines a small voltage range, preferably on the order of 100 mV, within which the input threshold may be allowed to vary.

This voltage range, which will be termed the threshold variation budget herein, is provided so that the input threshold may be allowed to drift slightly for example, as the chip begins to heat up during normal operation, without the circuit having to constantly respond to minor variations in the input threshold and thus draw an inordinate amount of power while potentially introducing an undesirable number of switching transients into the line receiver output.

It should be noted that the threshold variation budget, i.e., the design impedance resistor $R_3$ and the amount of current passing through the series-connected resistors, is a matter of design choice. The threshold variation budget may be set at any desired range depending on the receiver circuit performance requirements and the capabilities of the integrated circuit manufacturing process. For extremely precise switching performance, the threshold variation budget may be set as low as 10 mV if desired and even lower if power consumption is not an issue and provisions are made in the circuit design to minimize switch transient spikes and noise.

In accordance with the invention, the circuit of FIG. 5, includes a line receiver section 92 comprising a conventional receiver configured as an inverter 94 and two parallel-connected quasi-inverter circuits 96 and 98. As with the prior cases described above, the first parallel-connected quasi-inverter circuit 96 suitably comprises selectively addable p-channel and n-channel transistors, 103 and 105 respectively, connected in series with one another and with their gate terminals connected in common and to the receiver circuit's input 100. The quasi-inverter circuit 96 further comprises an additional, switchable select pull-up p-channel transistor 104 disposed between the selectively addable pull-up transistor 103 and $V_{DD}$ and also includes an additional switchable select, pull-down n-channel transistor 106 disposed between the selectively addable, pull-down n-channel transistor 105 and ground. The next quasi-inverter circuit 98 suitably comprises selectively addable p-channel and n-channel transistors, 108 and 112 respectively, connected in series with one another and with their gate terminals connected in common and coupled in parallel with the gate terminals of the preceding quasi-inverter 96 and the receiver circuit's input 100. The quasi-inverter circuit 98 further comprises an additional, switchable select pull-up p-channel transistor 110 disposed between the selectively addable pull-up transistor 108 and $V_{DD}$ and also includes an additional switchable select, pull-down n-channel transistor 114 disposed between the selectively addable pull-down n-channel transistor 112 and ground.

It will be apparent that unless an appropriate gate voltage is applied to the additional select pull-up and pull-down transistors, disposed in the conduction path of quasi-inverters 96 and 98, the quasi-inverters 96 and 98 will be normally non-operative and the switching characteristics of the receiver circuit 92 will be defined solely by operation of the conventional inverter stage 94 in response to a signal on the receiver input 100.

In accordance with practice of the invention, it should be further noted here that the n-channel and p-channel transistors comprising the conventional inverter stage 94 are designed in accordance with the design layout rules to be as nearly identical as possible to the n-channel and p-channel transistors comprising the input threshold reference circuit 90. In addition, all of the circuit elements will be understood to be connected to the same supply voltage and ground signal busses, in order to ensure that all of the circuit elements of the circuit of the invention experience the same electronic environment.

A logic circuit 116 is provided in accordance with the invention and provides means for connecting the outputs of the comparator circuits 82, 84, 86 and 88 to the gate terminals of the switchable select pull-up and pull-down transistors 104, 106, 110 and 114. The logic circuit 116 of FIG. 5 is illustrated in its simplest form, with a direct connection being made between the outputs of the first and second comparators 82 and 84 with the gate terminals of the select pull-down n-channel transistors 106 and 114 respectively. The outputs of the next comparators 86 and 88 are likewise coupled to the inputs of the select pull-up p-channel transistors 108 and 104 respectively.

Although logic section 116 is illustrated as providing signals to the pull-up p-channel transistors through a direct connection, it will be understood that a connection may equally be made through an inverting element if the inputs to the comparators 86 and 88 are reversed, i.e., if the input threshold reference were connected to the negative terminals and the reference voltage developed across the resistors were connected to the positive input terminal, as was the case with the illustrated embodiment of FIG. 4.

In operation, if the input threshold of the conventional inverter section 94 of the receiver section 92 were to rise, it will be expected that the input threshold reference of the threshold reference circuit 90 will also rise a corresponding amount. As the input threshold increases and exceeds the threshold variation budget as defined by resistor $R_3$ the comparator 84 turns on and its output goes from an active low to a high level. When comparator 84 goes high, and its value exceeds the turn-on threshold voltage of the select pull-down n-channel transistor 114, this transistor is consequently put in conduction and switches the selectively addable pull-down n-channel transistor 112 into the conduction path to ground potential. Accordingly, the pull-down β is increased and the input threshold of the receiver section 92 is consequently reduced.

If the input threshold, as developed by the threshold reference circuit 90, continues to increase, it will eventually rise an additional amount defined by the IR drop across resistor $R_2$, thus triggering the comparator 82 from an active low to a high state which in turn, turns on the additional select pull-down n-channel transistor 106. The select n-channel transistor 106 functions to switch an additional selectively addable pull-down n-channel transistor 105 into the conduction path to ground, thus increasing the pull-down β and consequently reducing the input threshold an additional amount.

In like fashion, if the input threshold were to decrease, to a value below the floor of the threshold variation budget, comparators 86 and 88 would be respectively activated and additional pull-up p-channel transistors would be selectively added to the conduction path. First the select pull-up p-channel 110 would be enabled to switch the selectively addable pull-up p-channel 108 into the circuit and next the select pull-up p-channel 104 would be enabled to switch the selectively addable pull-up p-channel 103 into the circuit. In accordance with the invention, these selectively addable pull-up transistors 103 and 108 would function to increase the pull-up β of the receiver section 92, consequently increasing the input threshold.

The degree of input threshold correction provided by the various additional pull-up or pull-down transistors which are switched into the circuit, depends necessarily on the design W/L ratio of the selectively addable transistors. Specifically, the first set of selectively addable transistors (n-channel 112 and p-channel 108) may be designed such that when introduced into the conduction path, the input threshold is caused to move approximately 100 mV; the n-channel dropping the input threshold by 100 mV, the p-channel raising the input threshold by 100 mV. If this amount of correction is insufficient, the next selectively addable transistors (n-channel 105 and p-channel 103) may be sized to shift the input threshold by 200 mV, either down or up respectively. The exemplary 200 mV input threshold adjust provided by the second set of selectively addable transistors may be provided in combination with the exemplary 100 mV input threshold shift provided by the first set of selectively addable transistors, for a total of 300 mV or alternatively, may be configured to provide an additional 100 mV input threshold shift which, in combination with the 100 mV shift provided by the first set of selectively addable transistors equals 200 mV, either up or down.

It will be further understood by those having skill in the art, that the logic section 116 of FIG. 5, may additionally include a latch provided at each of the four outputs which are connected to the gate terminals of the switches for the selectively addable pull-up and pull-down transistors. The benefits of providing the logic section 116 with latched outputs will be apparent when it is understood that the receiver section 92 is normally operating at switching frequencies in the Megahertz range. In many applications, it will be undesirable to dynamically adjust the input threshold of the receiver section while the circuit is in operation. Accordingly, the output latches of the logic section 116 would be preferably implemented as clocked flip-flops, with the clock signal operatively responsive to a command that may be issued by a control processor which might in turn be programmed to evaluate the status of for example, an input bus, which provides signals to the receiver section 92. The control processor may be programmed to issue a command clock signal to the logic section 116 when the signal bus is periodically inactive. In this manner, input threshold adjust may be periodically performed without degrading the primary function of the receiver section 92, i.e., receiving signals from a for example, fast signal bus.

Additional enhancements may be made to the present invention by configuring the input threshold reference circuit to provide a degree of feedback control in order to refine the input threshold adjustment procedure and to control input threshold within a threshold variation budget of about 10 mV.

Figure 6:
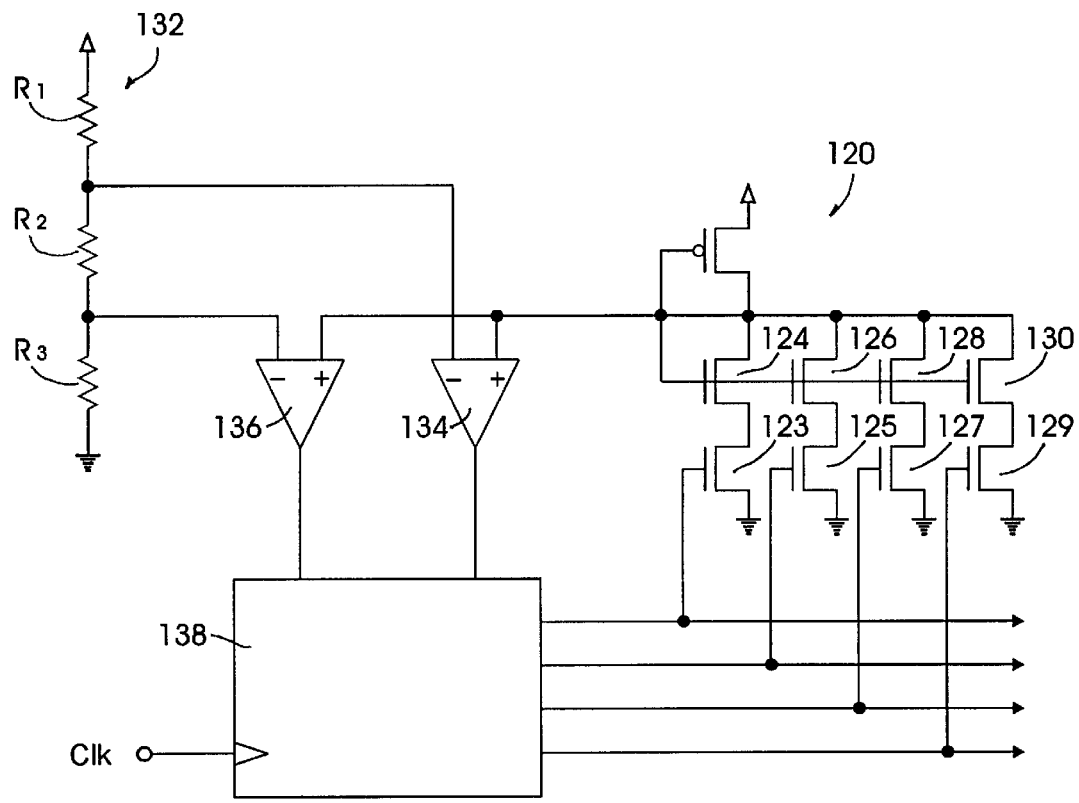
FIG. 6 is an integrated circuit schematic diagram of an input threshold characterization circuit including feedback in accordance with the invention.

Turning now to FIG. 6, an input threshold reference circuit, generally indicated at 120, is configured as an inverter, but with a multiplicity of selectively addable pull-down n-channel legs, connected in parallel fashion to a common drain. The selectively addable transistors are configured with their gate electrodes connected in common and with each such selectively addable transistor varying in its design W/L ratio. In particular, a first such selectively addable n-channel 124 is constructed with a W/L of 8, i.e., an 8×transistor; the second n-channel 126 is constructed with a W/L of 4, i.e., a 4×transistor; the next n-channel 128 is constructed with a W/L of 2, i.e., a 2×transistor, while the final selectively addable n-channel transistor 130 is constructed with a W/L ratio of 1, i.e., a 1×transistor. Each such selectively addable transistor is coupled to ground potential through a corresponding switchable select transistor (123, 125, 127, 129 respectively).

A resistor divider circuit 132 suitably comprises three series-connected resistors, $R_1$, $R_2$, and $R_3$ coupled between the supply voltage $V_{DD}$ and ground potential. A signal tap is taken from between resistors $R_1$ and $R_2$ and connected to the negative input of a first comparator 134. A signal tap is taken from between resistor $R_2$ and resistor $R_3$ and likewise connected to the negative input of a second comparator 136. The positive inputs of the comparators 134 and 136 are connected in common to the input/output terminal of the input threshold reference circuit 120 in like manner as that described in connection with FIGS. 3, 4, and 5 above.

In accordance with the invention, the threshold variation budget resistor, $R_2$ is designed to provide an approximately 10 mV drop, i.e., the threshold variation budget is set at about 10 mV. The outputs of the comparators 134 and 136 are connected to a logic circuit 138 operatively responsive to a clock signal, and which further provides selectable outputs connected in turn, to the gate terminals of the switchable select n-channel transistors 123, 125, 127 and 129 of the input threshold reference circuit 120.

In operation, in like manner as that described previously, the input threshold reference circuit 120 develops a steady-state input threshold value which is applied to the positive inputs of the comparator circuits 134 and 136. If the input threshold value is greater than the value developed by $V_{DD}$ minus the IR drop across resistor $R_1$, comparator 134 goes to a high state and logic circuitry 138 selectively enables a first switch to designate a first selectable n-channel transistor for inclusion in the conduction path, in response to a clock signal.

The input threshold of the reference circuit 120 will decrease as a consequence of the increased β on the pull-down leg induced by the logic circuit 138 turning on the 8×transistor 124. The new input threshold value is again evaluated by comparators 134 and 136 to determine if it is still higher than $V_{DD}$ minus $IR_1$ or alternatively, if it has now fallen sufficiently to exceed the floor of the 10 mV threshold variation budget ($V_{DD}$ minus $IR_1$ and $IR_2$).

In the first case, comparator 134 will remain in an active high state, while the second comparator 136 is at an active low. At a next clock signal, the logic circuitry 138 selects a next selectively addable n-channel transistor, i.e., the 4×transistor 126. The new input threshold, thus defined, is again evaluated by the comparators 134 and 136. If the addition of a second selectively addable pull-down transistor causes the input threshold to drop below the floor of the threshold variation budget, comparator 134 will be understood to switch from a high to a low state, while comparator 136 will switch from low to high. Accordingly, a different logical condition will be applied to the inputs of logic circuit 138 which, in response to the next clock signal, may cause the 4×transistor 126 to be turned off and the 2×transistor 128 to be turned on. The β of the pull-down leg is now a function of the 8×transistor 124 and the 2×transistor 128, in contrast to the previous case where it was a function of the 8×transistor 124 and the 4×transistor 126. Accordingly, it will be understood that the pull-down β was decreased slightly.

The input threshold is again evaluated by comparators 134 and 136 and, if necessary, further adjustment is made by for example, turning off the 2×transistor 128 and replacing it with the 1×transistor 130 in the conduction path. It will likewise be evident that the selectively addable n-channel transistors 124, 126, 128 and 130 may be combinatorial added to the conduction path as well. Indeed, it will be apparent that 15 separate combinations may be made of the four selectively addable n-channel pull-down transistors, so as to define 15 different pull-down "strengths" (betas) that may be added to the pull-down conduction path. Thus, the input threshold may be adjusted in 15 similar, sequential increments.

It will also be readily apparent, that the pull-up portion of the input threshold reference circuit 120 may be configured with selectively addable p-channel transistors, constructed with similarly varying W/L ratios. Thus, were the input threshold to be initially below the floor of the threshold variation budget, the pull-up betas of the input threshold reference circuit 120 may be selectively adjustable in the same manner as was described for the pull-down betas. All that is required would be additional outputs connected from the logic circuit 138 to the gate terminals of the selectively addable p-channel transistors of the reference circuit 120, and a consequent increase in the logic circuit's internal combinatorial logic.

It should be mentioned here, that the design of such combinatorial logic is well within the skill of a digital integrated circuit designer and need not be further described in the context of the present invention. Suffice it to say that such logic may be implemented as a simple decoder in combination with clocked-output latches or flip-flops.

Regardless of how implemented, once the logic circuitry 138 determines which of the selectively addable n-channel (and p-channel) transistors are to be added to the conduction path of the reference circuit 120 in order to maintain the input threshold within a 10 mV range, it will be understood that precisely the same selectively addable n-channel (or p-channel) transistors may be added to the conduction path of a line receiver circuit, in order to maintain its input threshold within the same 10 mV range. This may be accomplished by providing pull-up and pull-down transistors connected in parallel fashion into the conduction path of a line receiver with their gate electrodes controlled by the same signal lines connected between logic circuitry 138 and the input threshold reference circuit 120. Each of the selection signal lines may be connected through a 1-in, 2-out signal splitter circuit, with the signals which are provided to the line receiver being enabled in response to a separate select command. Accordingly, in accordance with the invention, the input threshold variation may be characterized by the threshold reference circuit 120 in combination with logic circuit 138 and the voltage divider, and only then may the line receiver be reconfigured in accordance with the input threshold characterization, by selectively adding corresponding pull-up or pull-down transistors to its conduction path.

Figure 7:
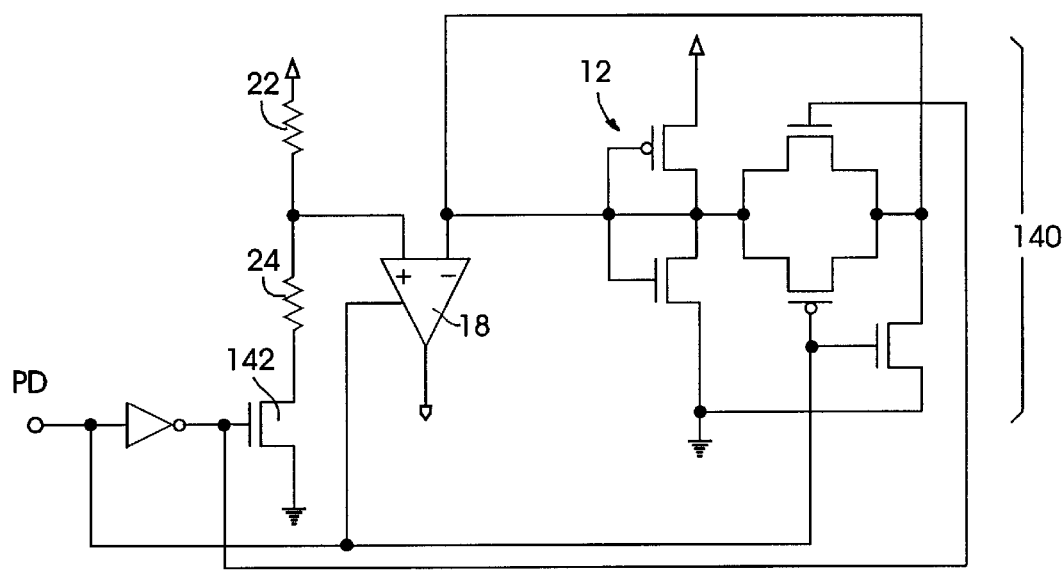
FIG. 7 is an integrated circuit schematic diagram depicting the exemplary embodiment of an input threshold characterization circuit of FIG. 3, including power-down circuitry for minimizing power consumption.

A further refinement may be made to any of the embodiments of the invention as illustrated in FIGS. 3, 4, 5 and 6, if the circuit application puts a premium on low power consumption. As is illustrated in FIG. 7, the exemplary conceptual circuit of FIG. 3 is depicted and includes power-down circuit means to power-down the input threshold reference circuit 12 and the comparator 18, and to turn-off current flow through the reference resistors 22 and 24. Upon receipt of a power-down signal (PD), the input threshold reference circuit 12 is taken out of triode operation and turned-off by operation of a power-down circuit 140. In addition, the power down signal (PD) turns off an n-channel transistor 140 connected between ground potential and resistor 24 of the voltage divider, causing current flow through the resistors to cease. The comparator 18 is likewise turned-off in a manner well understood by those having skill in the art of integrated circuit design. It should be noted here that where power down features are required in the circuit of the present invention, it will be preferable for the signals which selectively add n-channel and p-channel transistors to the conduction path of the receiver section, to be latched by the logic circuitry. Otherwise, as the characterization section is shut down, gate control signals on the selectively addable transistors may well be lost and the input threshold adjustment rendered inoperative.

In accordance with practice of principles of the present invention, a circuit has been described which is able to characterize a change in an input threshold from a, design value, by comparing the input threshold of a reference circuit to reference voltages developed across series-connected resistors. The input threshold reference value is developed by a circuit designed to be identical with a for example, line receiver which would thus have the same input threshold value. The comparison results are processed in order to provide selection signals which selectively add either pull-up or pull-down active devices to the line receiver's conduction path, so as to dynamically adjust the input threshold of the line receiver. Although the various embodiments of the circuit are depicted and have been described in terms of specific numbers of resistors and selectively addable n-channel and p-channel active components, it will be evident to one having skill in the art that such circuits may be designed with a significantly greater number of active components and/or resistors, in order to vastly increase the precision of input threshold adjustment. It will also be evident that the number of pull-up active devices need not be equal to the number of pull-down active devices. Indeed, depending on the absolute value of the design input threshold, a greater number of pull-down devices may be provided in order to obtain greater control over the upper end of the input threshold range. Alternatively, a greater number of pull-up active devices may be provided if a greater degree of control is desired for the lower end of the input threshold range.

The above description of the exemplary embodiments of an integrated circuit design for input threshold margin tracking is for illustrative purposes. Because of variations which will be apparent to one having skill in the art, the present invention is not intended to be limited to the particular embodiments described above. Such variations and other modifications and alterations are included within the scope and intent of the invention as described in the following claims.

What is claimed is:

1. An integrated circuit for dynamically determining an input threshold margin and adjusting the input threshold of an active circuit element in operative response thereto, the integrated circuit comprising:

circuit means for defining a steady-state input threshold value, said input threshold value being substantially equal to the input threshold value of the active circuit element;

means for establishing a reference voltage, said reference voltage representing a design input threshold value, whereby the means for establishing the reference voltage is substantially unaffected by manufacturing process tolerance variations;

means for comparing the steady-state input threshold to the reference voltage, said comparison means further for providing at least one selection signal in response to the comparison; and a plurality of selectively addable transistors, connected to the active circuit element, the selectively addable transistors being selectively enabled by said at least one selection signal so as to be selectively added to a pull-up or pull-down conduction path of the active circuit element in response to a determination by said means for comparing that the steady-state input threshold is higher or lower, respectively, than the reference voltage.

2. The integrated circuit according to claim 1, wherein the active circuit element comprises a line receiver configured as an inverter and wherein the circuit means for defining a steady-state input threshold value comprises an inverter element having its input and output connected together.

3. The integrated circuit according to claim 2 wherein the means for establishing a reference voltage further comprises means for defining an input threshold margin window within which the steady-state input threshold value is allowed to vary.

4. The integrated circuit according to claim 3, wherein the means for establishing a reference voltage comprises series-connected resistors coupled between a first potential and a second, lower potential.

5. The integrated circuit according to claim 4, wherein the active circuit element and the circuit means for defining a steady-state input threshold value are coupled between said first potential and said second, lower potential.

6. The integrated according to claim 5, wherein the plurality of selectable addable transistors comprises CMOS transistors.

7. The integrated circuit according to claim 4, wherein the series-connected resistors are constructed as a monolithic integrated circuit, and wherein said series-connected resistors are constructed as a ratio of resistors.

8. An integrated circuit for dynamically determining an input threshold margin and adjusting the input threshold of an active circuit element in operative response thereto, the integrated circuit comprising:

an input threshold reference circuit, including n-channel and p-channel transistors configured as an inverter element having an input and an output commonly connected so as to define an input threshold;

a voltage divider network comprising series-connected resistors, the voltage divider network providing a multiplicity of reference voltages, a difference between sequential reference voltages defining an input threshold margin window;

comparator means connected to compare the input threshold value provided by the input threshold reference circuit to each of said reference voltages provided by the voltage divider, the comparator means providing at least one selection signal in response to the input threshold of the threshold reference circuit falling outside the input threshold margin window defined by the voltage divider; and a plurality of selectively addable transistors, connected to the active circuit element, the selectively addable transistors being selectively enabled by said at least one selection signal so as to be selectively added to a pull-up or pull-down conduction path of the active circuit element in response to a comparison determination that the input threshold of the input threshold reference circuit is outside the input threshold margin window.

9. The integrated circuit of claim 8 wherein the active circuit element comprises a line receiver including n-channel and p-channel transistors configured as an inverter, the plurality of selectively addable transistors being connected in parallel fashion to the pull-up and pull-down conduction path of the inverter such that when selectively added to the pull-up or pull-down conduction path the pull-up or pull down $\beta$ is increased.

10. The integrated circuit according to claim 9, wherein the input threshold reference circuit and the line receiver are constructed with corresponding n-channel and p-channel transistors having the same size and are positioned in sufficient proximity to one another on an integrated circuit chip so as to have substantially identical input threshold values.

11. The integrated circuit according to claim 8, wherein the voltage divider comprises 5 series-connected resistors, each resistor defining a voltage value represented by an IR drop across said resistor, said voltage values defining a first smaller input threshold margin window magnitude and a second larger input threshold margin window magnitude.

12. The integrated circuit according to claim 11, the comparison means providing a first selection signal when the input threshold value of the input threshold reference circuit lies outside the first input threshold margin window and inside the second input threshold margin window, said first selection signal enabling a first selectively addable transistor, and wherein the comparison means provides a second selection signal when the input threshold value of the input threshold reference circuit falls outside the second input threshold margin window, said second selection signal enabling a second selectively addable transistor.

13. The integrated circuit according to claims 12, wherein the first selectively addable transistor provides a first input threshold magnitude adjustment to the active circuit element and wherein the second selectively addable transistor provides a second input threshold magnitude adjustment, different from the first transistor.

14. The integrated circuit according to claim 13 further comprising a logic circuit connected between the comparison means and the plurality of selectively addable transistors, the logic circuit decoding selection signals from the comparison means and selectively enabling particular ones of the plurality of selectively addable transistors so as to adjust the input threshold of the active circuit element to its design value to compensate for manufacturing process parameter induced threshold shift.

15. The integrated circuit according to claim 14, wherein the logic circuit comprises clocked latches.

16. The integrated circuit according to claim 15, further comprising means for powering-down said input threshold reference circuit, said voltage divider and said comparison means, the clocked latches retaining selection signals for selectively enabling particular ones of the selectively addable transistors, so as to maintain the adjusted input threshold value of the active circuit element.

17. An integrated circuit for dynamically determining an input threshold margin and adjusting the input threshold of an active circuit element in operative response thereto, the integrated circuit comprising:
   input threshold reference circuit means for defining a steady-state input threshold value;
   reference voltage means for establishing a plurality of reference voltages, said reference voltages representing an input threshold margin window;
   comparison means connected to the input threshold reference circuit means and the reference voltage means, for comparing the steady-state input threshold to the input threshold margin window, the comparison means for providing selection signals in operative response thereto; and
   a plurality of selectively addable transistors, connected to the active circuit element, the selectively addable transistors being selectively enabled by said selection signals so as to be selectively added to a pull-up or pull-down conduction path of the active circuit element in response to a determination that the steady-state input threshold is outside the input threshold margin window.

18. The integrated circuit according to claim 17, the input threshold reference circuit means further comprising a plurality of selectively addable transistors, coupled to the comparison means, the selectively addable transistors being selectively enabled by said selection signals so as to be selectively added to a pull-up or pull-down conduction path of the input threshold reference circuit means in response to a determination that the steady-state input threshold is outside the input threshold margin window.

19. The integrated circuit according to claim 18, wherein the selectively addable transistors coupled to the input threshold reference circuit means are logically enabled by the comparison means so as to adjust the input threshold value of the input threshold reference circuit means to fall within the input threshold margin window.

20. The integrated circuit according to claim 19, wherein the logical selection of selectively addable transistors of the input threshold reference circuit means are directed to the plurality of selectively addable transistors connected to the active circuit element, so as to adjust the input threshold value of the active circuit element to the same magnitude and polarity as the adjustment provided to the input threshold reference circuit means.

* * * * *